(12) United States Patent
Cho et al.

(10) Patent No.: US 9,362,475 B2
(45) Date of Patent: Jun. 7, 2016

(54) THERMOELECTRIC MATERIAL INCLUDING CONFORMAL OXIDE LAYERS AND METHOD OF MAKING THE SAME USING ATOMIC LAYER DEPOSITION

(71) Applicant: GM GLOBAL TECHNOLOGY OPERATIONS LLC, Detroit, MI (US)

(72) Inventors: Jung Young Cho, Troy, MI (US); Dongjoon Ahn, Rochester Hills, MI (US); James R. Salvador, Royal Oak, MI (US); Gregory P. Meisner, Ann Arbor, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 95 days.

(21) Appl. No.: 14/223,570

(22) Filed: Mar. 24, 2014

(65) Prior Publication Data

US 2015/0270466 A1 Sep. 24, 2015

(51) Int. Cl.
*H01L 21/00* (2006.01)
*H01L 35/22* (2006.01)
*H01L 35/34* (2006.01)

(52) U.S. Cl.
CPC ............... *H01L 35/22* (2013.01); *H01L 35/34* (2013.01)

(58) Field of Classification Search
CPC ......... H01L 35/22; H01L 35/34; C07C 45/50; C07C 47/02
USPC ................................................ 438/34, 48, 54
See application file for complete search history.

(56) References Cited

U.S. PATENT DOCUMENTS

| 6,222,242 B1* | 4/2001 | Konishi | C22C 38/42 257/467 |
|---|---|---|---|
| 2003/0003634 A1* | 1/2003 | Lowrey | H01L 21/28562 438/133 |
| 2004/0112418 A1* | 6/2004 | Yang | H01L 35/20 136/239 |
| 2008/0119098 A1 | 5/2008 | Palley et al. | |

FOREIGN PATENT DOCUMENTS

WO WO2004/032256 4/2004

OTHER PUBLICATIONS

He Zeming, et al., "Nano ZrO2/CoSb3 composites with improved thermoelectric figure of merit", Nanotechnology 18 (2007) 235602 (5 pages).
He, Zerning, et al., "Effect of ceramic dispersion on thermoelectric properties of nano-ZrO2/CoSb3 composites", Journal of Applied Physics 101, 043707 (2007) (7 pages).

* cited by examiner

*Primary Examiner* — Duy T Nguyen
(74) *Attorney, Agent, or Firm* — Dierker & Kavanaugh, P.C.

(57) ABSTRACT

A thermoelectric material includes a substrate particle and a plurality of conformal oxide layers formed on the substrate particle. The plurality of conformal oxide layers has a total oxide layer thickness ranging from about 2 nm to about 20 nm. The thermoelectric material excludes oxide nanoparticles. A method of making the thermoelectric material is also disclosed herein.

11 Claims, 5 Drawing Sheets

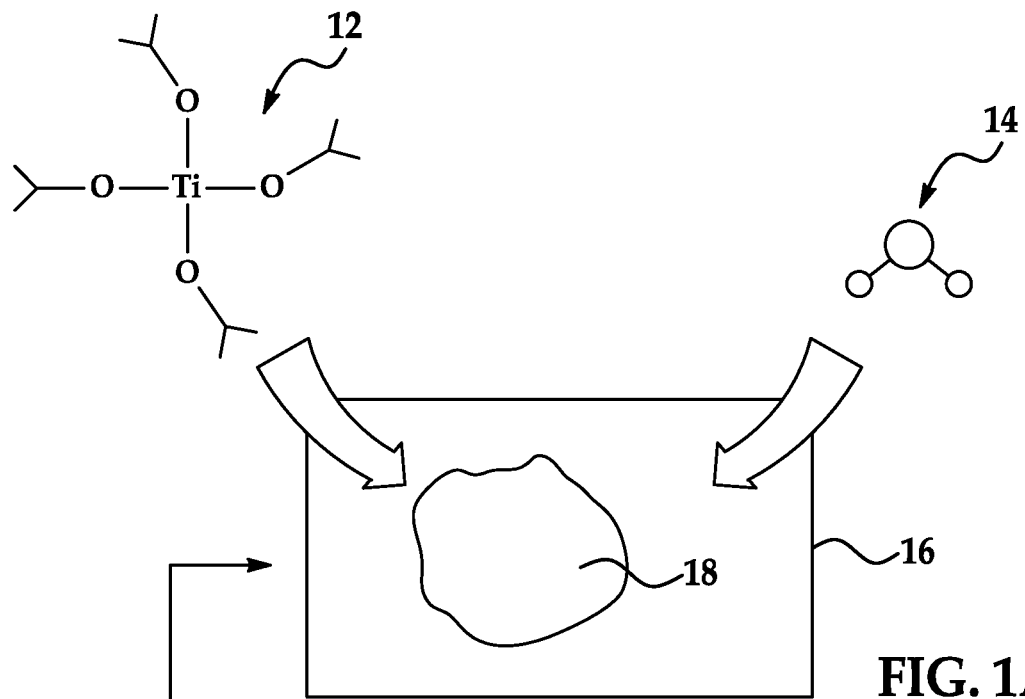
FIG. 1A
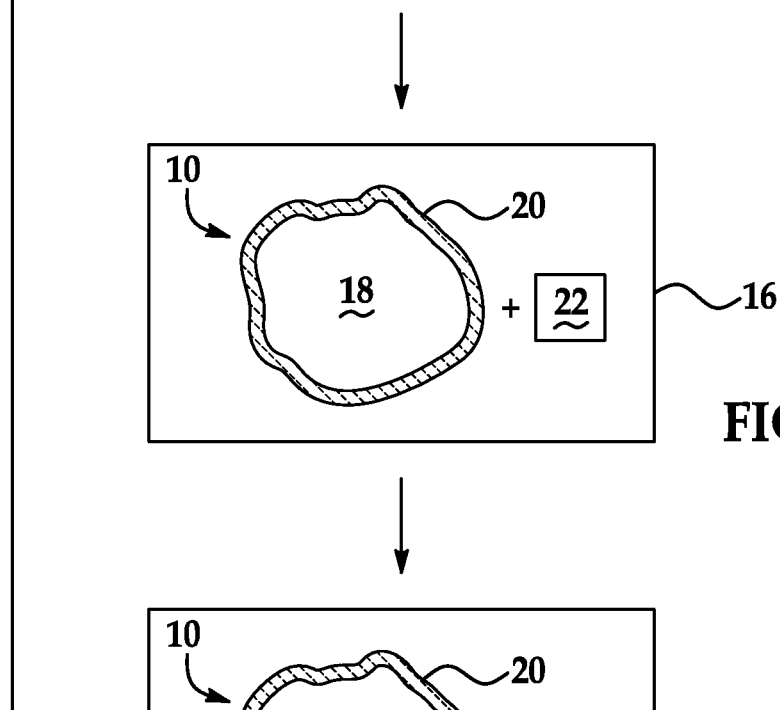
FIG. 1B
FIG. 1C ial's figure of merit, ZT, defined as
THERMOELECTRIC MATERIAL INCLUDING CONFORMAL OXIDE LAYERS AND METHOD OF MAKING THE SAME USING ATOMIC LAYER DEPOSITION

STATEMENT REGARDING FEDERALLY SPONSORED RESEARCH OR DEVELOPMENT

This invention was made with Government support under DE-EE0000014 awarded by the DOE (Department of Energy). The Government has certain rights in this invention.

BACKGROUND

Advanced thermoelectric applications for high efficiency thermoelectric materials include solid state thermoelectric devices for converting thermal energy into electrical energy, and for cooling using electricity. Thermoelectric materials may be used in an electrical circuit between a high temperature junction and a low temperature junction. For thermoelectric power generation, a temperature difference between the junctions is utilized to convert a portion of the heat flowing from the hot junction to the cold junction directly into electrical energy. For thermoelectric cooling, electrical energy is used to transfer heat from a cold junction to a hot junction. Thermoelectric technology may be of interest in many areas, including, for example, the automotive industry due to the potential for waste heat recovery to improve fuel economy and for heating ventilation and air conditioning using less power.

SUMMARY

A thermoelectric material and a method of making the thermoelectric material are disclosed herein. An example of the thermoelectric material includes a substrate particle and a plurality of conformal oxide layers formed on the substrate particle. The plurality of conformal oxide layers has a total oxide layer thickness ranging from about 2 nm to about 20 nm. The thermoelectric material excludes oxide nanoparticles.

BRIEF DESCRIPTION OF THE DRAWINGS

Features and advantages of examples of the present disclosure will become apparent by reference to the following detailed description and drawings, in which like reference numerals correspond to similar, though perhaps not identical, components. For the sake of brevity, reference numerals or features having a previously described function may or may not be described in connection with other drawings in which they appear.

FIGS. 1A through 1C schematically illustrate an example of a method for making a thermoelectric material;

DETAILED DESCRIPTION

Figure 2:
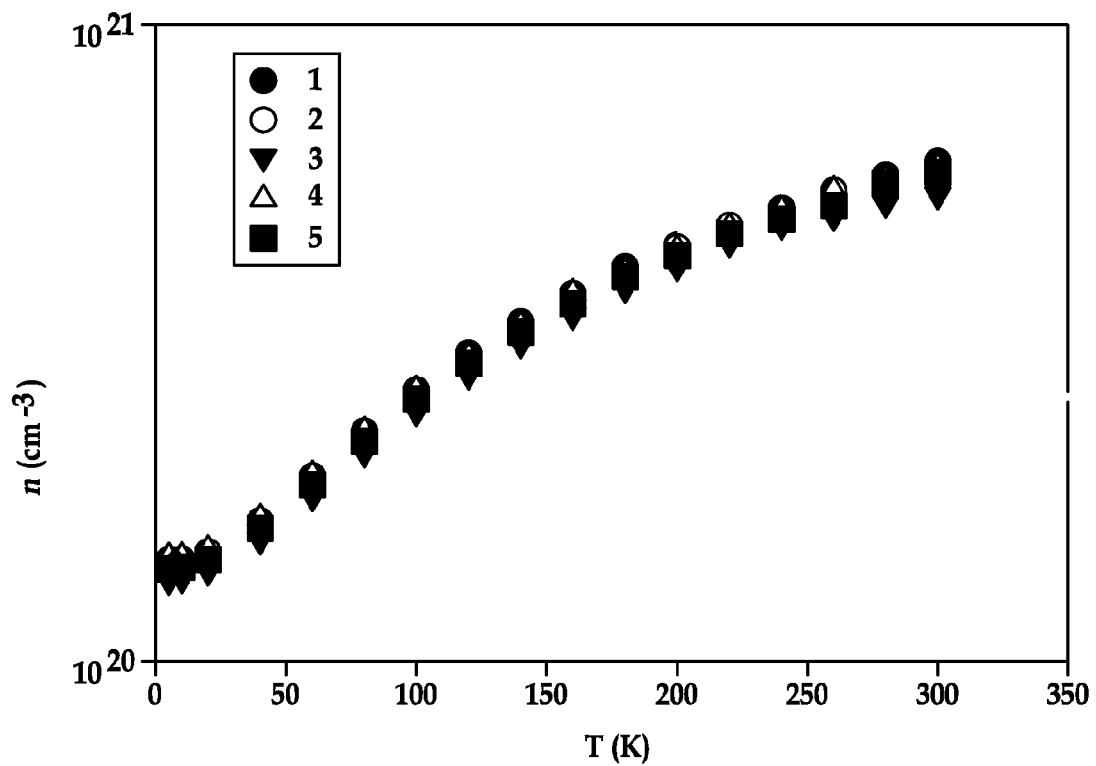
FIG. 2 is a graph depicting the temperature dependence of the carrier concentration for a comparative thermoelectric material and four example thermoelectric materials.

The energy conversion efficiency and cooling coefficient of performance (COP) of a thermoelectric (TE) material are determined by the dimensionless TE material's figure of merit, ZT, defined as $$ZT = \frac{S^2 T}{\rho \kappa_{total}} = \frac{S^2 T},{\rho(\kappa_L + \kappa_e)},$$

where S, T, $\rho$, $\kappa_{total}$, $\kappa_L$, and $\kappa_e$ are the Seebeck coefficient, absolute temperature, electrical resistivity, total thermal conductivity, lattice thermal conductivity and electronic thermal conductivity, respectively. The larger the ZT values, the higher the efficiency or the Coefficient of Performance (COP). It is desirable that good thermoelectric materials possess a large Seebeck coefficient S, a low electrical resistivity $\rho$, and a low total thermal conductivity $\kappa_{total}$. The Seebeck coefficient S is measure of how readily the respective charge carriers (electrons or holes) can transfer energy as they migrate through a thermoelectric material that is subjected to a temperature gradient. The type of charge carriers, whether electron or hole, depends on the dopants (N-type or P-type) in the semiconductor used to form the thermoelectric materials.

In theory, to increase ZT and the TE material's thermal to electric conversion efficiency, it would be desirable to lower the total thermal conductivity $\kappa_{total}$, which consists of contributions from the lattice, i.e., $\kappa_L$, and from the charge carriers, i.e., $\kappa_e$, without deteriorating the power factor ($S^2/\rho$). However, this requires the decoupling of thermal and electrical transport, which has proven to be difficult. In particular, the introduction of a secondary phase in the form of particles to the thermoelectric material (e.g., at grain boundaries, as inclusions, or anywhere else in the material) has been found to decrease the lattice thermal conductivity $\kappa_L$. However, the secondary phase particles also have been found to enhance the scattering of charge carriers, which reduces the power factor.

In the examples disclosed herein, a thermoelectric material has been identified that lowers the lattice thermal conductivity $\kappa_L$ without deteriorating the power factor ($S^2/\rho$). The thermoelectric material disclosed herein incorporates a conformal oxide layer on a substrate particle. A substrate particle is made up of a plurality of grains with grain boundaries between respective grains within the particle. The conformal oxide layer is capable of scattering heat carrying phonons while not affecting charge carrier mobility. By "conformal oxide layer" it is meant that the material(s) making up the layer will uniformly coat all exterior surfaces (i.e., not interior boundaries between grains) of the substrate particle, regardless of the particle's morphology. The conformal oxide layer is specifically engineered using atomic layer deposition to have a specific total thickness ranging from about 2 nm to about 20 nm, and to be completely devoid of nanoparticles. By "completely devoid of nanoparticles", it is meant that no nanoparticles are present i) on or in the oxide layer, ii) at the boundary of the oxide layer and the exterior surface of the substrate particle, iii) in the interior of the grains that make up the substrate particle, iv) at grain boundaries between grains of the substrate particle, v) as inclusions within the substrate particle or its grains, or vi) anywhere else on or in the substrate particle. The thickness and conformal nature of the oxide layer contribute to a reduction in the phonon free mean path via geometric scattering at grain boundary interfaces. In particular, the conformal oxide layer preferentially performs geometric scattering of phonons with mean free paths on an order of the total oxide layer thickness, while having minimal or no effect on charge carrier mobility. The lack of nanoparticles in and/or on the oxide layer and the substrate particle, moreover, maintains the absence of any detrimental effects on charge carrier mobility due to the presence of the oxide material in the thermoelectric material.

The decoupling of the thermal and electrical transport observed in the thermoelectric materials disclosed herein was unexpected, due in part to the room temperature value of the thermal conductivity of rutile (which is about 10 W/m·K). Following a mixture rule, it would be expected that a composite of the substrate particle (e.g., a skutterudite) and the oxide layer (e.g., $TiO_2$) would have a higher total thermal conductivity at a given temperature, for example, when compared to a Ba-filled skutterudite (which has a relatively low thermal conductivity). However, as is illustrated in the EXAMPLE provided herein, the present inventors observed the opposite. It is believed that the unexpected and desirable thermoelectric behavior of the materials disclosed herein is due, at least in part, to the conformal oxide layer being formed in a particular manner to include particular characteristics and exclude other characteristics so that the scattering of phonons alone results from the conformal oxide layer and the grain boundaries it creates.

Referring now to FIGS. 1A through 1C, an example of a method for making an example of the thermoelectric material is schematically depicted.

FIG. 1A illustrates a few of the steps of the method. In an example, the method initially involves selecting an oxide precursor 12 and a substrate particle 18. The selection of the oxide precursor 12 will depend, at least in part, upon the substrate particle 18 that is selected. It is desirable that the oxide precursor 12 that is used be one whose byproduct(s) during atomic layer deposition (ALD) will not degrade the selected substrate particle 18. For example, if a filled skutterudite material (one example of which may be a Ba-filled skutterudite material) is selected as the substrate particle 18, $TiCl_4$ precursors will not be used because the HCl byproducts of the condensation reaction deteriorate the filled skutterudite material.

The oxide precursor 12 may be a metal oxide precursor that forms a titanium oxide layer (e.g., $TiO_2$), a zirconium oxide layer (e.g., $ZrO_2$), a hafnium oxide layer (e.g., $HfO_2$), tantalum oxide layer (e.g., $Ta_2O_5$), or a tungsten oxide layer (e.g., $WO_3$). In the examples disclosed herein, suitable titanium oxide precursors include tetrakis(dimethylamino) titanium (TDMAT), tetrakis (diethylamino) titanium (TDEAT), tetrakis(ethylmethylamino) titanium (TEMAT), methylcyclopentienyl, tris(dimethylamido) titanium, bis(diethylamino) bis(diisopropylamino)titanium (IV), tetrakis(diethylamido) titanium (IV), tetrakis(dimethylamido) titanium (IV), titanium tetra-iospropoxide (shown in FIG. 1A), tetrakis(ethylmethylamido) titanium, and combinations thereof. Examples of suitable zirconium oxide precursors include bis(methyl-$\eta^5$-cyclopentadienyl)methoxymethylzirconium (i.e., $Zr(CH_3C_5H_4)_2CH_3OCH_3$), tetrakis(dimethylamido)zirconium(IV), tetrakis(ethylmethylamido)zirconium(IV), zirconium(IV) tert-butoxide, and combinations thereof. Some suitable hafnium oxide precursors 12 include bis(methyl-$\eta^5$-cyclopentadienyl)dimethylhafnium, bis(methyl-$\eta^5$-cyclopentadienyl)methoxymethylhafnium, hafnium(IV) tert-butoxide, tetrakis(dimethylamido)hafnium(IV), tetrakis(diethylamido)hafnium(IV), tetrakis(ethylmethylamido) hafnium(IV), and combinations thereof. Still other examples of suitable oxide precursors 12 include tantalum oxide precursors, such as tantalum(V) ethoxide, tris(diethylamido) (tert-butylimido)tantalum(V), and combinations thereof, and tungsten oxide precursors, such as tungsten hexacarbonyl ($W(CO)_6$). While several examples have been provided, it is believed that other oxide precursors 12 may be used, as long as they do not degrade the selected substrate particle 18.

Suitable substrate particles 18 include skutterudite-based materials, $Bi_2Te_3$-based materials, half-Heusler materials, $Mg_2Si$, and MnSi. Any skutterudite of the type $Ni_xCo_{1-x}Pn_3$ (where Pn is Sb, As, or solid solutions thereof, and x is a maximum of 0.1), $Fe_xCo_{1-x}Pn_3$ (where Pn is Sb, As, or solid solutions thereof, and x is a maximum of 0.1), or $M_yCoSb_3$ (where M=Li, Na, K, Rb, Ca, Sr, Ba, La, Ce, Pr, Nd, Yb, In, Ga, Tl, or combinations thereof) may be used. In $Ni_xCo_{1-x}Pn_3$ and $Fe_xCo_{1-x}Pn_3$, x is a maximum of 0.1. In $M_yCoSb_3$, the maximum value of y will change based on the location of the element M in the periodic table. For example, for Na, y has a maximum value of about 0.6, and for Ce, y has a maximum value of about 0.12. It is to be understood that the maximum y value may or may not result in the best ZT. $Bi_2Te_3$-based materials include $Bi_2Te_3$ or alloys containing Sb substitution of Bi, or Se and S substitution of Te. To tune the transport properties of n-type and p-type $Bi_2Te_3$ based alloys respectively, Bi may be alloyed with Sb, and Te may be alloyed with Se and S. Examples of the half-Heusler materials include $ZrNi_{1+x}Sn$ (x ranges from 0 to 0.5), $HfNi_{1+x}Sn$ (x ranges from 0 to 0.5), $TiNi_{1+x}Sn$ (x ranges from 0 to 0.5), $ZrCo_{1+x}Sb$ (x ranges from 0 to 0.5), $HfCo_{1+x}Sb$ (x ranges from 0 to 0.5), $TiCo_{1+x}Sb$ (x ranges from 0 to 0.5), a solid solution of any of these materials, and combinations thereof.

As shown schematically in FIG. 1A, the substrate particle 18 is placed into an atomic layer deposition (ALD) chamber 16. While a single particle is shown in FIG. 1A for illustrative purposes, it is to be understood that a fine grained powder of the bulk substrate material may be used. The individual substrate particles or grains generally have a size ranging from about 0.5 μm to about 50 μm.

In the ALD process, a pulsing process is performed to introduce the metal oxide precursor 12 and a small fraction of water vapor 14 to the chamber 16. In an example, the pulsing process is performed for a time ranging from about 0.5 seconds to about 2 seconds. During the pulsing process, the precursor pressures in the chamber 16 range from about 0.25 Torr to about 1.0 Torr. The water vapor 14 should be sufficient to provide an equal number of water molecules for the valence of the precursor metal. For example, 4 water molecules completely decompose a tetravalent metal precursor, 3 water molecules completely decompose a trivalent metal precursor, and 2 water molecules completely decompose a divalent metal precursor. The temperature of the substrate particle 18 within the ALD chamber 16 ranges from about 120° C. to about 180° C.

After the pulsing process, there is a waiting period or exposure period. The waiting/exposure period generally ranges from about 0.5 seconds to about 2 seconds. As an example, the waiting/exposure period is about 2 seconds long. During this waiting/exposure period, the hydrolysis reaction between the oxide precursor 12 and water vapor 14 takes place. The hydrolysis reaction forms the conformal oxide layer 20 on the surface of the substrate particle 18 (as shown in FIG. 1B), and thus forms the thermoelectric material 10. The pulsing process forms a single atomic layer of the oxide material. This oxide layer 20 conformally coats the surface of the substrate particle, regardless of the particle's morphology. As such, the oxide layer 20 that is formed has a uniform thickness and is free of oxide nanoparticles.

As shown in FIG. 1B, in addition to forming the conformal oxide layer 20, the hydrolysis reaction also forms an alcohol byproduct 22. In an example in which Ba-filled skutterudite is used as the substrate particle 18 and titanium tetra-isopropoxide is used as the oxide precursor 12, benign isopropanol is formed as the alcohol byproduct 22. Depending upon the oxide precursor 12 and substrate particle 18 that are selected, additional byproducts 22 that are not deleterious to the substrate particle 18 may also form.

The method then involves evacuating the ALD chamber 16 to remove the byproduct(s) 22 using a vacuum pump. This step is illustrated in FIG. 1C because the byproduct(s) 22 is/are no longer present in the ALD chamber 16. The residual pressure in the ALD chamber 16 after the evacuation is performed is about $10^{-6}$ Torr.

FIGS. 1A through 1C illustrate one example of an ALD cycle. The ALD cycle (i.e., pulse, waiting/exposure, and evacuation) may then be repeated a number of times in order to form additional conformal oxide layers (not shown) on the conformal oxide layer 20. In an example, the number of ALD cycles ranges from 25 to 100.

Repeating the ALD cycle forms a plurality of conformal oxide layers. The total thickness of all of these layers together (i.e., the total oxide layer thickness) ranges from about 2 nm to about 20 nm. By increasing the number of ALD cycles and thereby the total oxide layer thickness, it has been found that the thermal conductivity of the thermoelectric material 10 may be reduced without deteriorating the electric transport properties of the thermoelectric material 10. It is believed, however, that if the total oxide layer thickness extends beyond 20 nm, electron conduction (resistivity) will be affected in a negative manner. As such, in the examples disclosed herein, the number of ALD cycles is controlled so that the plurality of conformal oxide layers 20 together have a total thickness ranging from about 2 nm to about 20 nm.

Upon completion of the ALD cycles, the thermoelectric material 10 that is formed has a core/shell structure. The core is made up of the substrate particle 18, and the shell is made up of the plurality of conformal oxide layers 20. The core/shell thermoelectric material 10 may be exposed to a consolidation process to form a solid specimen. During the consolidation process, it is to be understood that the thermoelectric material 10 may be processed with or without untreated substrate particles 18. It is to be understood that the thermal conductivity value of the resulting thermoelectric material 10 may be further tuned by performing the consolidation process with untreated substrate materials. An example of the consolidation process is spark plasma sintering (i.e., pulsed electric current sintering). This process sinters the thermoelectric material 10 into a fully dense billet.

In an example, spark plasma sintering may involve heating the core/shell material at a rate ranging from about 50° C./min to about 75° C./min to a temperature ranging from about 600° C. to about 650° C. with the application of uniaxial pressure ranging from about 50 MPa to about 60 MPa. The core/shell material is then held at this temperature and pressure for about 5 minutes before allowing the material to cool to room temperature.

For the consolidation process, spark plasma sintering may be more desirable than other processes, such as, for example, hot pressing. This is due, at least in part, to the fact that Ostwald ripening is often not observed with spark plasma sintering (i.e., neither the particles nor the grains within the particles grow in size). Because the consolidation process does not affect the very short total thickness scale of the oxide layers 20 formed in the ALD cycles, mid to long wavelength acoustic phonons (i.e., those responsible for heat transport) are scattered effectively by a combination of point defect, grain boundary geometrical, and lattice strain mechanisms. The Fermi-wavelength and resulting mean free path of the charge carriers tends to be much longer than the phonon wavelengths and mean free paths, indeed much longer than the total thickness of the conformal oxide layers 20 disclosed herein, and thus the charge carriers are not scattered as strongly. The fact that the charge carriers do not strongly interact with the oxide layers 20 means the mobility of the carriers is not affected and electrical resistivity of the substrate particle 18 remains unchanged. The total thickness of the conformal oxide layers 20 acts to decouple the thermal and electrical transport.

As an example, the thermoelectric material 10 exhibits a thermoelectric figure of merit ZT of at least 0.14 at 300K and a lattice thermal conductivity $\kappa_L$ less than 3.5 W/K·m at 300 K. The thermoelectric materials 10 disclosed herein are believed to exhibit desirable ZT and $\kappa_L$ at higher temperatures as well.

To further illustrate the present disclosure, an example is given herein. It is to be understood that this example is provided for illustrative purposes and is not to be construed as limiting the scope of the disclosed example(s).

EXAMPLE

Sample and Comparative Sample Preparation

Parent Ba-filled skutterudite material ($Ba_{0.3}Co_4Sb_{12}$; ca. ~35 g) was synthesized from high purity elements Ba (99.9%, Alfa Aesar), Co (99.998%, Alfa Aesar), and Sb (99.9999%, Alfa Aesar) through a melting and annealing process. The $Ba_{0.3}Co_4Sb_{12}$ material was used as a comparative sample (i.e., Comparative Sample 1 with no conformal oxide layer formed thereon), and as the substrate particle for four samples having conformal oxide layers formed thereon (i.e., Samples 2-5).

For each of Samples 2-5, 7 grams of the ground and annealed $Ba_{0.3}Co_4Sb_{12}$ powder was spread out onto a respective thin glass plate and put into an ALD chamber to form $TiO_2$ layers thereon. For the ALD cycles, titanium tetra-isopropoxide ($[Ti(OPr^i)_4]$) and water were used as the precursors. Argon served both as a carrier and a purging gas. The temperatures for the $[Ti(OPr^i)_4]$ and water precursors were set at 80° C. each, and the temperature of the ALD chamber for the reactions was set at 200° C. Each ALD cycle consisted of a 2 second pulse, a 2 second exposure, and 5 second evacuation for water and $[Ti(OPr^i)_4]$.

Table 1 illustrates the number of ALD cycles performed.

TABLE 1

Number of ALD cycles

| Sample # | # ALD Cycles |
|---|---|
| Comparative Sample 1 | 0 |
| Sample 2 | 25 |
| Sample 3 | 50 |

TABLE 1-continued

Number of ALD cycles

| Sample # | # ALD Cycles |
|---|---|
| Sample 4 | 75 |
| Sample 5 | 100 |

Comparative Sample 1 and each of Samples 2-5 (after all ALD cycles were complete) were then consolidated by spark plasma sintering under a dynamic vacuum with a residual pressure of 4 Pa at 903 K and the application of 50 MPa uniaxial pressure.

Tests Performed

Low temperature thermal and electrical transport properties (3.5 K to 340 K) were evaluated on parallelepiped-shaped test coupons using a 2-probe configuration with a Quantum Design Physical Property Measurement system using the thermal transport option. Electrical and thermal connections were made with Wood's metal.

4-probe electrical resistivity and Hall effect measurements were made on the samples, which had typical dimensions of 2 mm in width, 0.5 mm in thickness, and 6 mm in length. Measurements were performed using an AC resistance bridge to minimize Seebeck voltage effects, and a cryostat equipped with a 5 T magnet was used to control sample temperature and the magnetic field for Hall effect.

Results and Discussion

Figure 3:
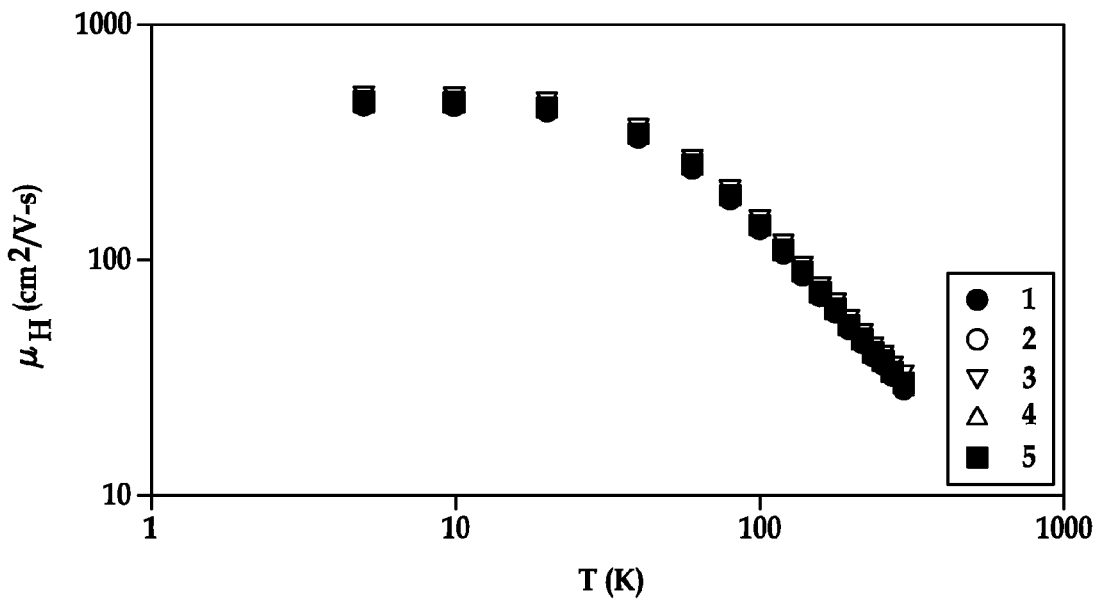
FIG. 3 is a graph depicting the temperature dependence of the Hall mobility for the comparative thermoelectric material and the four example thermoelectric materials.

FIG. 2 shows the temperature dependence of the carrier concentration (n) and FIG. 3 shows the temperature dependence of the Hall mobility ($u_H$) for Comparative Sample 1 (labeled "1") and Samples 2-5 (labeled "2" through "5", respectively).

The Hall mobility is derived from the Hall coefficient ($R_H$, where $n=1/R_H\cdot e$, and e is the fundamental charge) and the electrical resistivity ($\rho=1/n\cdot e\cdot \mu_H$). Because the carrier concentration and mobility are roughly the same for Comparative Sample 1 and Samples 2-5, it can be shown that the electrical resistivity also has the same magnitude and temperature dependence irrespective of $TiO_2$ content (see FIG. 4). Above ~100 K, the temperature dependence of $\mu_H$ follows a $\sim T^{3/2}$ power law indicating that acoustical phonons are the dominant charge carrier scattering mechanism as has been found for other partially filled n-type skutterudites.

Figure 4:
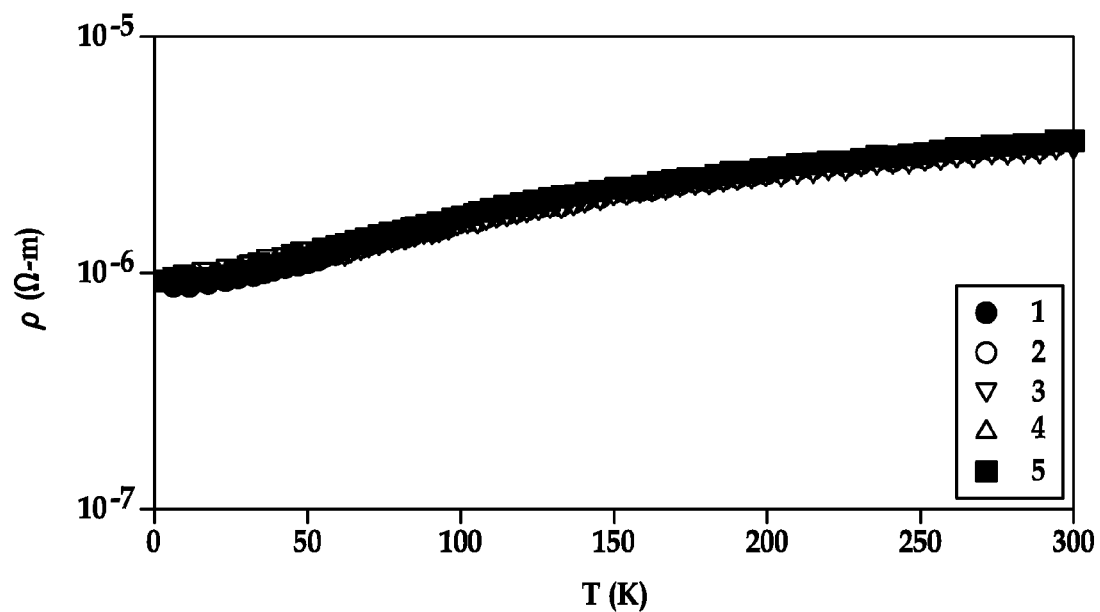
FIG. 4 is a graph depicting the temperature dependence of the electrical resistivity for the comparative thermoelectric material and the four example thermoelectric materials.
Figure 5:
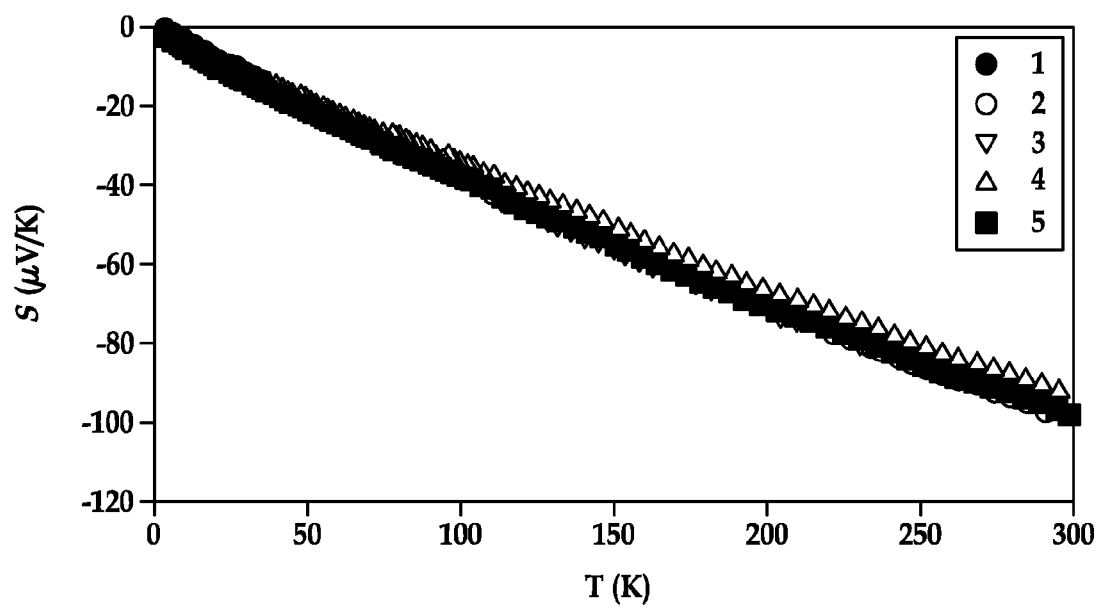
FIG. 5 is a graph depicting the temperature dependence of the Seebeck coefficient for the comparative thermoelectric material and the four example thermoelectric materials.

FIGS. 4 and 5 illustrate the temperature dependence of electrical resistivity (ρ) and the Seebeck coefficient (S), respectively. In accordance with the results for n and $\mu_H$ shown in FIGS. 2 and 3, the resistivity was about the same for Comparative Sample 1 and Samples 2-5. Additionally, the S was negative and of the same magnitude for Comparative Sample 1 and Samples 2-5. These results are consistent with the results of the Hall effect measurements (FIG. 3). The magnitude of S is roughly inversely proportional to the carrier concentration by the expression:

$$S = -\frac{k_B}{e}\left[\delta + \ln\left(\frac{N}{n}\right)\right]$$

where N is the density of states, δ is a term associated with the kinetic energy of the carriers, and $k_B$ is Boltzmann's constant.

Figure 6A:
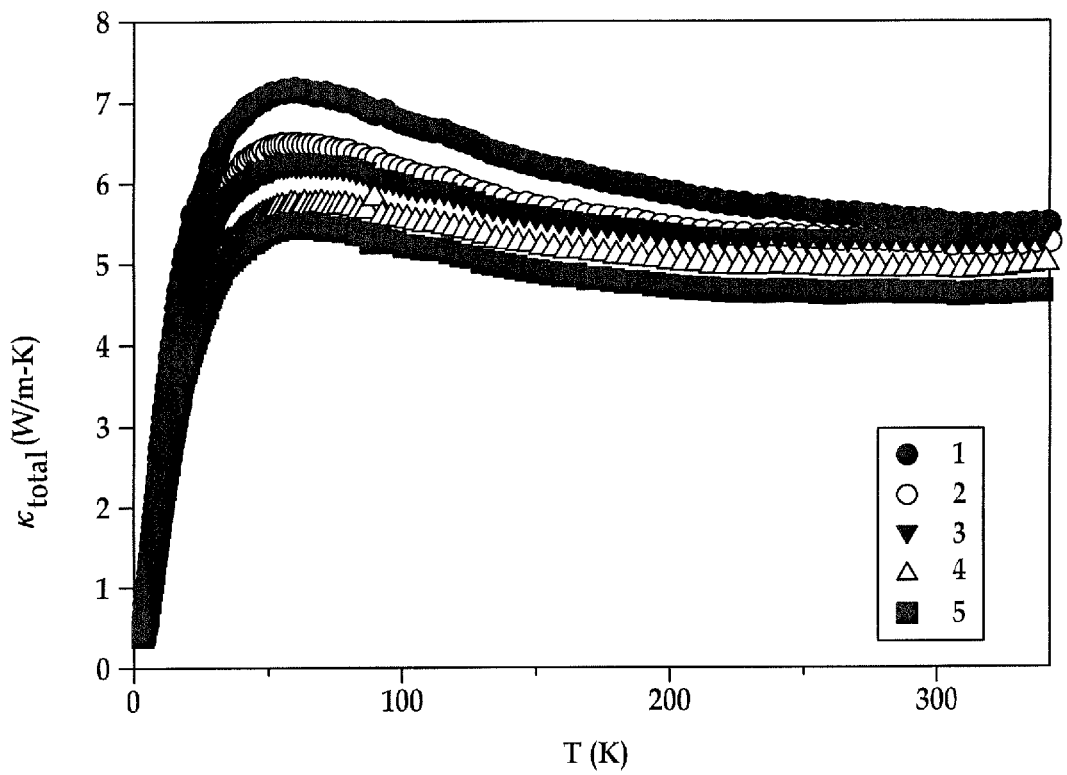
FIGS. 6A and 6B are graphs depicting the temperature dependence of the total thermal conductivity (FIG. 6A) and the lattice thermal conductivity (FIG. 6B) for the comparative thermoelectric material and the four example thermoelectric materials.
Figure 6B:
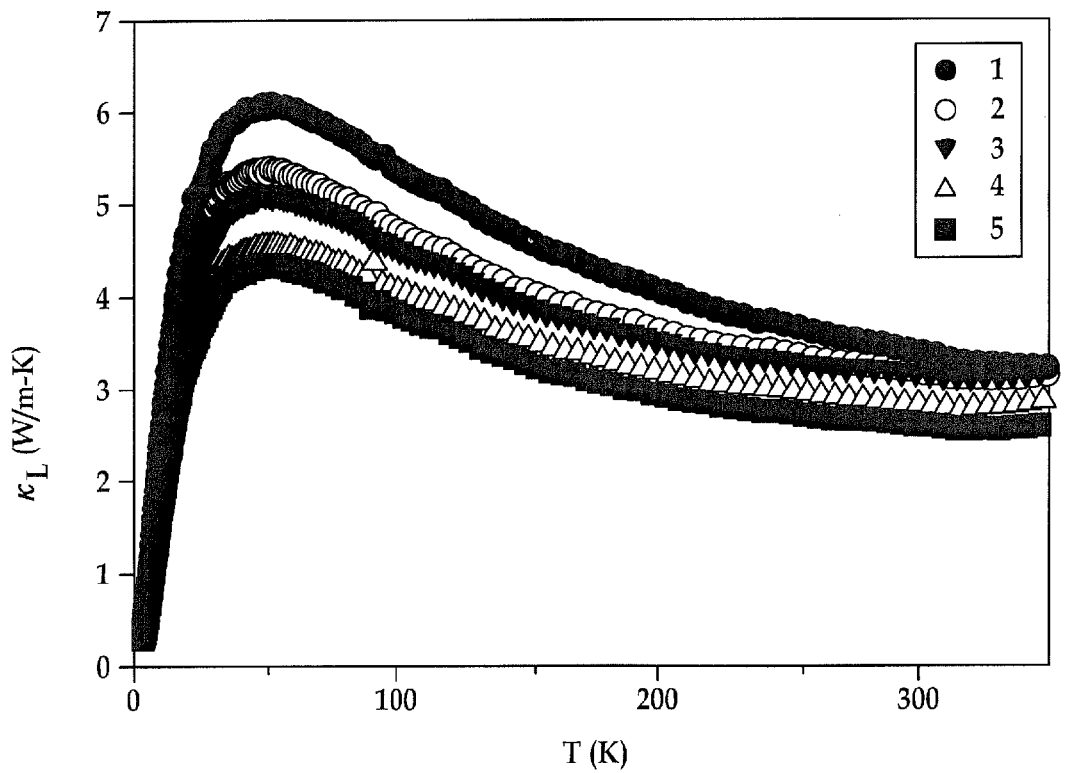

FIG. 6A shows the total thermal conductivity ($\kappa_{Total}$) and FIG. 6B shows the lattice thermal conductivity ($\kappa_L$) as a function of temperature for Comparative Sample 1 and Samples 2-5 with the different loadings of $TiO_2$. As can be seen in both figures, there is a large reduction in the total and lattice thermal conductivities for Samples 2-5 in including the conformal oxide layers compared to Comparative Sample 1 at low temperatures (~50 K). At these temperatures, the reductions are monotonic with increasing ALD processing cycles. At even lower temperatures (<10 K) there is no significant difference in the temperature dependence of $\kappa_{Total}$ and $\kappa_L$. At temperatures approaching 300 K, the large differences observed in the magnitude of $\kappa_{total}$ and $\kappa_L$ at lower temperature are somewhat diminished, but Sample 5 still maintains a 17% reduction in total thermal conductivity ($\kappa_{Total}$) as compared to Comparative Sample 1.

The effect demonstrated in FIGS. 6A and 6B can be understood by inspecting the total oxide layer thickness present in Samples 2-5 and the phonon wavelength and mean free paths as they relate to impurity scattering. Within the Callaway model, the relaxation times of various phonon scattering mechanisms are summed via Matheson's rule, and generally include such things as grain boundary, and point defect (impurity) scattering phonon-electron, and phonon-phonon scattering events, such as Umklapp and normal processes. For impurity scattering from conformal layers with nm thickness scales or dimensions comparable to the phonon wavelength, the relaxation time ($\tau_D$) can be expressed as:

$$\tau_D^{-1} = \frac{v\sigma_{sct}(X)}{V}$$

where v is the phonon group velocity, $\sigma_{sct}$ is the phonon scattering cross section as a function of X (the size/shape parameter), and V is the volume density of the nm-scaled impurity. The size parameter X can be further defined as X=k·R where k is the phonon wave vector and R is the radius of the scattering particle. As R becomes very small (on the order of an Å), the scattering is said to be of Rayleigh type with $\sigma_{sct}\sim 2\cdot R^6/\lambda^4$ and suggests that in such cases phonons with very short wavelengths (i.e., phonons at the Brillouin zone edge) are scattered most strongly, leading to strong reductions in total and lattice thermal conductivity by alloy-like scattering. On the other hand, as X gets very large, geometrical scattering dominates such grain boundary effects, which scatter only the longest wavelength and lowest energy portion of the phonon spectrum. To scatter mid- to long-wave length phonons, conformal oxide layers on the order of 2 to 20 nm have been found to be desirable, and more significant reductions in $\kappa_{Total}$ and $\kappa_L$ can be realized depending on the wavelength of phonons which are responsible for the majority of heat conduction. The conformal oxide layers with this total thickness span the gap between Rayleigh and geometrical scattering and offer more features from which to scatter a broader range of the phonon spectrum. From crystal structure data, it is estimated that the $TiO_2$ conformal oxide layers of Samples 2-5 had a total oxide layer thickness ranging from about 4 nm to 16 nm resulting from the 25 to 100 deposition cycles.

Figure 7:
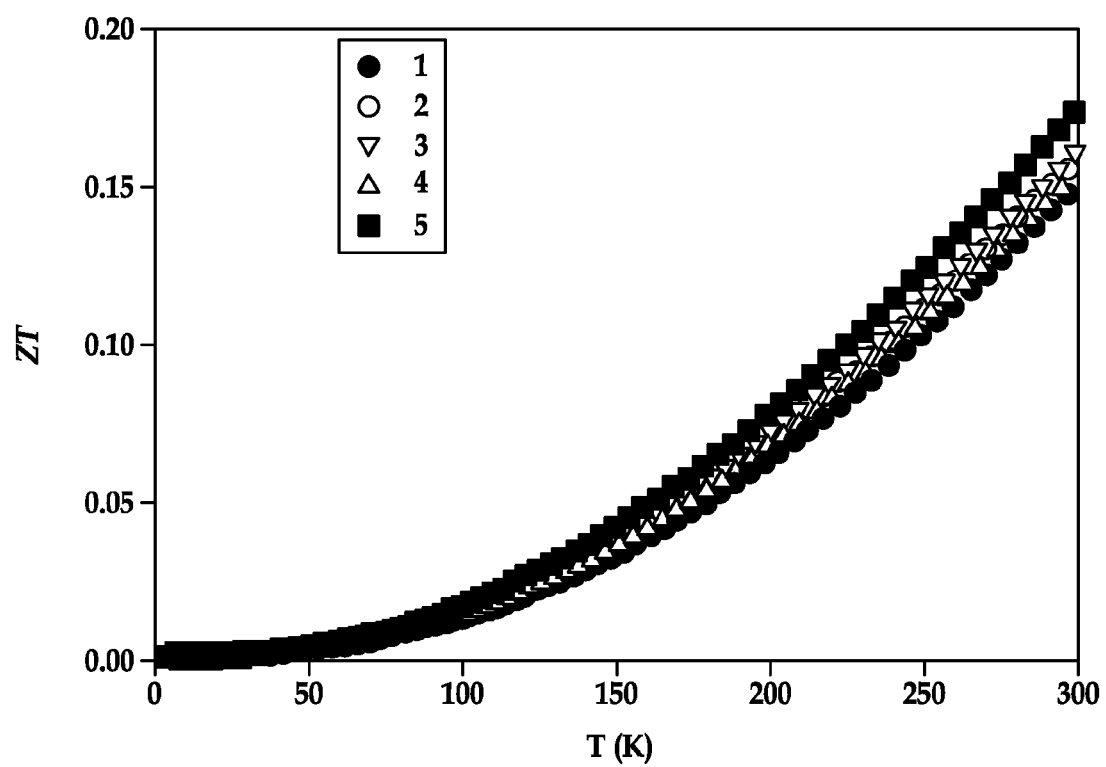
FIG. 7 is a graph depicting the temperature dependence of the thermoelectric figure of merit for the comparative thermoelectric material and the four example thermoelectric materials.

The reduction in $\kappa_{Total}$ and $\kappa_L$ without deleterious effects to the electrical transport properties (again see FIGS. 2-5) was attributed to the selective scattering of phonons with mean free paths that are on the order of the total thickness scale of $TiO_2$ shells (i.e., the conformal oxide layers). It is believed that the mean free paths of the charge carriers are different from the thickness scales of these $TiO_2$ conformal layers that they are not scattered sufficiently to deteriorate charge carrier mobility. For Sample 5, the resulting 17% reduction in the thermal conductivity without a significant reduction in the power factor results in and approximately 20% improvement in the value of ZT at room temperature (compared to Comparative Sample 1). The ZT results are shown in FIG. 7. As depicted, each of Samples 2-5 had an improved ZT as compared to Comparative Sample 1.

The temperature dependences of the total thermal conductivity ($\kappa_{Total}$) for Samples 2-5 were also similar to those of Comparative Sample 2, namely, $In_{0.53}Ga_{0.47}As$ doped with ErAs nanoparticles (as reported by W. Kim, et al., *Phys. Rev. Lett.* 96, 045901 (2006)). With Comparative Sample 2, there was a substantial decrease in total thermal conductivity ($\kappa_{Total}$) at low temperatures, but at higher temperatures (room temperature and above) the size effects of the particles on the scattering of phonons was diminished as Umklapp scattering began to dominate. Because Umklapp scattering is intrinsic to the lattice's composition and its dynamics, one may expect that at sufficiently high temperatures the thermal conductivity of the $In_{0.53}Ga_{0.47}As$ doped with ErAs nanoparticles will be comparable to Comparative Example 1 (i.e., the parent alloy without any conformal oxide layers).

Alloy scattering methods for improving thermoelectric performance are very effective at lowering total thermal conductivity ($\kappa_{Total}$), but often lead to undesirable decreases in carrier mobility. The size effect scattering arising from the conformal oxide layer thickness demonstrated here preserves the carrier mobility while effectively scattering a certain spectrum of phonons associated with heat transport. Because the total oxide layer thickness can be tailored by modifying the number of ALD cycles, hierarchical composites consisting of optimized nanostructural features for maximizing the scattering of heat carrying phonons is possible. As illustrated by the results shown in FIGS. 2 through 7, these thermoelectric materials have lower thermal conductivity as compared to Comparative Example 1 while exhibiting very good electric transport properties similar to Comparative Example 1.

Reference throughout the specification to "one example", "another example", "an example", and so forth, means that a particular element (e.g., feature, structure, and/or characteristic) described in connection with the example is included in at least one example described herein, and may or may not be present in other examples. In addition, it is to be understood that the described elements for any example may be combined in any suitable manner in the various examples unless the context clearly dictates otherwise.

It is to be understood that the ranges provided herein include the stated range and any value or sub-range within the stated range. For example, a range from about 2 nm to about 20 nm should be interpreted to include not only the explicitly recited limits of from about 2 nm to about 20 nm, but also to include individual values, such as 5.8 nm, 7.5 nm, 18 nm, etc., and sub-ranges, such as from about 3 nm to about 17 nm; from about 5 nm to about 15 nm, etc. Furthermore, when "about" is utilized to describe a value, this is meant to encompass minor variations (up to +/−5%) from the stated value.

In describing and claiming the examples disclosed herein, the singular forms "a", "an", and "the" include plural referents unless the context clearly dictates otherwise.

While several examples have been described in detail, it will be apparent to those skilled in the art that the disclosed examples may be modified. Therefore, the foregoing description is to be considered non-limiting.

What is claimed is:

1. A method for making a thermoelectric material, the method comprising:
   selecting a substrate particle from the group consisting of skutterudite-based materials, $Bi_2Te_3$-based materials, half-Heusler materials, $Mg_2Si$, and MnSi;
   selecting an oxide precursor whose byproduct during atomic layer deposition will not degrade the substrate particle;
   depositing the oxide precursor on the substrate particle via the atomic layer deposition, thereby forming a conformal oxide layer on the substrate particle without forming any oxide nanoparticles and forming the thermoelectric material; and
   controlling a number of atomic layer deposition cycles to obtain a plurality of conformal oxide layers having a total oxide layer thickness ranging from about 2 nm to about 20 nm, thereby reducing thermal conductivity of the thermoelectric material without deteriorating electric transport properties of the thermoelectric material.

2. The method as defined in claim 1 wherein the half-Heusler materials are selected from the group consisting of $ZrNi_{1+x}Sn$ (x=0 to 0.5), $HfNi_{1+x}Sn$ (x=0 to 0.5), $TiNi_{1+x}Sn$ (x=0 to 0.5), $ZrCo_{1+x}Sb$ (x=0 to 0.5), $HfCo_{1+x}Sb$ (x=0 to 0.5), $TiCo_{1+x}Sb$ (x=0 to 0.5), a solid solution of any of these materials, and combinations thereof.

3. The method as defined in claim 1 wherein the oxide precursor is selected from the group consisting of tetrakis(dimethylamino) titanium (TDMAT), tetrakis (diethylamino) titanium (TDEAT), tetrakis(ethylmethylamino) titanium (TEMAT), methylcyclopentienyl, tris(dimethylamido) titanium, bis(diethylamino)bis(diisopropylamino)titanium (IV), tetrakis(diethylamido) titanium (IV), tetrakis(dimethylamido) titanium (IV), titanium iospropoxide, tetrakis(ethylmethylamido) titanium, and combinations thereof.

4. The method as defined in claim 1 wherein the number of the atomic layer deposition cycles ranges from 25 to 100.

5. The method as defined in claim 1, further comprising exposing the thermoelectric material to a consolidation process to form a solid specimen of the thermoelectric material.

6. The method as defined in claim 5 wherein the consolidation process includes spark plasma sintering under vacuum.

7. The method as defined in claim 1 wherein each atomic layer deposition cycle includes:
   introducing the oxide precursor and water vapor into an atomic layer deposition (ALD) chamber;
   allowing a predetermined time period to pass, whereby hydrolysis of the oxide precursor and the water occur within the ALD chamber to form the conformal oxide layer and a byproduct; and
   evacuating the ALD chamber to remove the byproduct using a vacuum pump.

8. A method for controlling thermal conductivity of a thermoelectric material, the method comprising:
   depositing an oxide precursor on a substrate particle via an atomic layer deposition cycle, thereby forming a conformal oxide coating on the substrate particle without forming any oxide nanoparticles, wherein the substrate particle is selected from the group consisting of skutterudite-based materials, $Bi_2Te_3$-based materials, half-Heusler materials, $Mg_2Si$, and MnSi; and
   repeating the atomic layer deposition cycle a predetermined number of times to obtain a plurality of conformal oxide layers having a total oxide layer thickness ranging from about 2 nm to about 20 nm, whereby increasing the predetermined number of times the atomic layer deposition cycle is performed decreases the thermal conductivity.

9. The method as defined in claim 8 wherein
the oxide precursor is selected from the group consisting of tetrakis(dimethylamino) titanium (TDMAT), tetrakis (diethylamino) titanium (TDEAT), tetrakis(ethylmethylamino) titanium (TEMAT), methylcyclopentienyl, tris(dimethylamido) titanium, bis(diethylamino)bis(diisopropylamino)titanium (IV), tetrakis(diethylamido) titanium (IV), tetrakis(dimethylamido) titanium (IV), titanium iospropoxide, tetrakis(ethylmethylamido) titanium, and combinations thereof.

10. The method as defined in claim 8 wherein the predetermined number of times ranges from 25 to 100.

11. The method as defined in claim 8, further comprising exposing the thermoelectric material to spark plasma sintering to form a solid specimen.

* * * * *